US010943638B2

(12) United States Patent
Hong

(10) Patent No.: US 10,943,638 B2
(45) Date of Patent: Mar. 9, 2021

(54) SEMICONDUCTOR MEMORY DEVICE AND OPERATING METHOD THEREOF

(71) Applicant: SK hynix Inc., Gyeonggi-do (KR)

(72) Inventor: Yun-Gi Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/726,724

(22) Filed: Dec. 24, 2019

(65) Prior Publication Data
US 2020/0327929 A1 Oct. 15, 2020

(30) Foreign Application Priority Data

Apr. 10, 2019 (KR) .................. 10-2019-0042030

(51) Int. Cl.
| | | |
|---|---|---|
| G11C 7/00 | (2006.01) | |
| G11C 11/406 | (2006.01) | |
| G11C 11/4076 | (2006.01) | |

(52) U.S. Cl.
CPC .... G11C 11/40615 (2013.01); G11C 11/4076 (2013.01); G11C 11/40611 (2013.01)

(58) Field of Classification Search
CPC ............ G11C 11/406; G11C 11/40618; G11C 11/40615; G11C 11/40622; G11C 2211/4065; G11C 2211/4068; G11C 29/02; G11C 5/04; G11C 11/4063; G11C 11/408; G11C 29/785; G11C 29/802; G11C 29/808; G11C 5/02; G11C 8/12; G11C 5/025; G11C 7/22; G11C 2229/743; G11C 29/70; G11C 29/818; G11C 5/063; G11C 7/1006; G11C 7/1075; G11C 11/4076; G06F 11/1008; G06F 11/108; H01L 2224/16145; H01L 23/481; H01L 25/18; H01L 2224/16225; H01L 2225/06513; H01L 2225/06517; H01L 25/0657; H01L 2924/15311
USPC ....... 365/222, 230.03, 200, 189.07, 201, 63, 365/185.09, 189.15, 205, 225.7, 230.01, 365/230.08, 51, 154, 189.03, 189.05, 191, 365/230.06, 231; 714/E11.034, 758, 763
See application file for complete search history.

(56) References Cited

U.S. PATENT DOCUMENTS

2009/0282189 A1* 11/2009 Best ...................... G11C 11/406
711/106

FOREIGN PATENT DOCUMENTS

| KR | 10-0856069 | 9/2008 |
|---|---|---|
| KR | 10-2016-0094767 | 8/2016 |

* cited by examiner

*Primary Examiner* — Thong Q Le
(74) *Attorney, Agent, or Firm* — IP & T Group LLP

(57) ABSTRACT

A semiconductor memory device may include a plurality of banks; a plurality of address storage circuits respectively corresponding to the plurality of banks, and suitable for storing refresh addresses of corresponding banks; an output control circuit suitable for, based on a refresh command signal and a test mode signal, generating an output clock and selectively outputting, as output data, a refresh address outputted from any one of the address storage circuits or bank data provided from the banks; an output buffer suitable for outputting the output data to a plurality of data input/output pads based on the output clock; and a strobe signal generation circuit suitable for generating a data strobe signal based on the output clock and outputting the data strobe signal through a data strobe pad.

20 Claims, 8 Drawing Sheets

SEMICONDUCTOR MEMORY DEVICE AND OPERATING METHOD THEREOF

CROSS-REFERENCE TO RELATED APPLICATION

This application claims priority under 35 U.S.C. § 119 to Korean Patent Application No. 10-2019-0042030 filed on Apr. 10, 2019, which is incorporated herein by reference in its entirety.

BACKGROUND

1. Field

Various embodiments relate to a semiconductor design technology, and more particularly, to a semiconductor memory device that performs a refresh operation.

2. Discussion of the Related Art

Each memory cell in a semiconductor memory device is composed of a transistor serving as a switch and a capacitor for storing charge (corresponding to data). Data of a memory cell is determined as "high" (i.e., logic 1) or "low" (i.e., logic 0) depending on whether the capacitor is charged or discharged in the memory cell, that is, whether a voltage of a storage node of the capacitor is high or low.

In principle, since data storage is in the form of an accumulation of charges in the capacitor, no power consumption is required to maintain data. However, since an amount of charges charged in the capacitor can be reduced due to a leakage current by the PN junction of the transistor, data may be lost. In order to substantially prevent such a concern, it is necessary to read data in the memory cell before the data is lost and recharge a normal charge amount according to the read information. Since data storage is substantially maintained only when such an operation is periodically repeated, the replenishing process of the cell charge is referred to as a refresh operation.

Semiconductor memory devices perform a refresh operation in response to a refresh command that is received externally. In order to verify whether the refresh operation is normally performed every predetermined timing, it is necessary to recognize information on a row (i.e., a word line) currently accessed by the memory device. Typically, determining whether the refresh operation is normally performed occurs by reading data stored in the memory cell whenever the refresh operation is completed or when entering a test mode at a specific point in time. Therefore, a significant amount of time for verification of the refresh operation is required. Furthermore, it is difficult to recognize, in real-time, a row in which an error has occurred.

SUMMARY

Various embodiments are directed to a semiconductor memory device capable of accurately verifying and analyzing a refresh operation during the refresh operation and an operating method thereof.

In an embodiment, a semiconductor memory device may include: a plurality of banks; a plurality of address storage circuits respectively corresponding to the plurality of banks, and suitable for storing refresh addresses of corresponding banks; an output control circuit suitable for, based on a refresh command signal and a test mode signal, generating an output clock and selectively outputting, as output data, a refresh address outputted from any one of the address storage circuits or bank data provided from the banks; an output buffer suitable for outputting the output data to a plurality of data input/output pads based on the output clock; and a strobe signal generation circuit suitable for generating a data strobe signal based on the output clock and outputting the data strobe signal through a data strobe pad.

In another embodiment, a semiconductor memory device may include: a plurality of banks; a plurality of address storage circuits respectively corresponding to the plurality of banks, and suitable for storing refresh addresses of corresponding banks; a plurality of address transfer circuits respectively corresponding to the address storage circuits, and suitable for transferring, in response to a plurality of transfer enable signals, the refresh addresses stored in corresponding address storage circuits as an output address; a selection circuit suitable for selecting the output address or bank data based on a refresh command signal and a test mode signal to output as output data; and an output buffer suitable for outputting the output data through a plurality of input/output pads based on an output clock.

In another embodiment, a semiconductor memory device may include: a plurality of banks; a plurality of address storage circuits respectively corresponding to the plurality of banks, and suitable for storing refresh addresses of corresponding banks; a plurality of address transfer circuits respectively corresponding to the address storage circuits, and suitable for transferring, in response to a plurality of transfer enable signals, the refresh addresses stored in corresponding address storage circuits as an output address; a cycle generation circuit suitable for generating an oscillating clock in response to a refresh command signal and generating the transfer enable signals that are sequentially activated based on the oscillating clock; a selection circuit, based on a refresh period signal and a test mode signal, suitable for selecting the output address or bank data to output as output data, and selecting the oscillating clock and a clock to output as an output clock; and an output buffer suitable for outputting the output data through a plurality of input/output pads based on the output clock.

In another embodiment, a semiconductor memory device may include: a plurality of banks; and a plurality of address storage circuits suitable for storing refresh addresses respectively corresponding to the plurality of banks, wherein a refresh address outputted from any one of the address storage circuits is outputted through a data output path when a refresh operation is performed.

In accordance with the embodiments, the semiconductor memory device may output, in real-time, row addresses for each bank accessed when a refresh operation is performed, so that it is possible to accurately verify and analyze the refresh operation.

DETAILED DESCRIPTION

Figure 1:
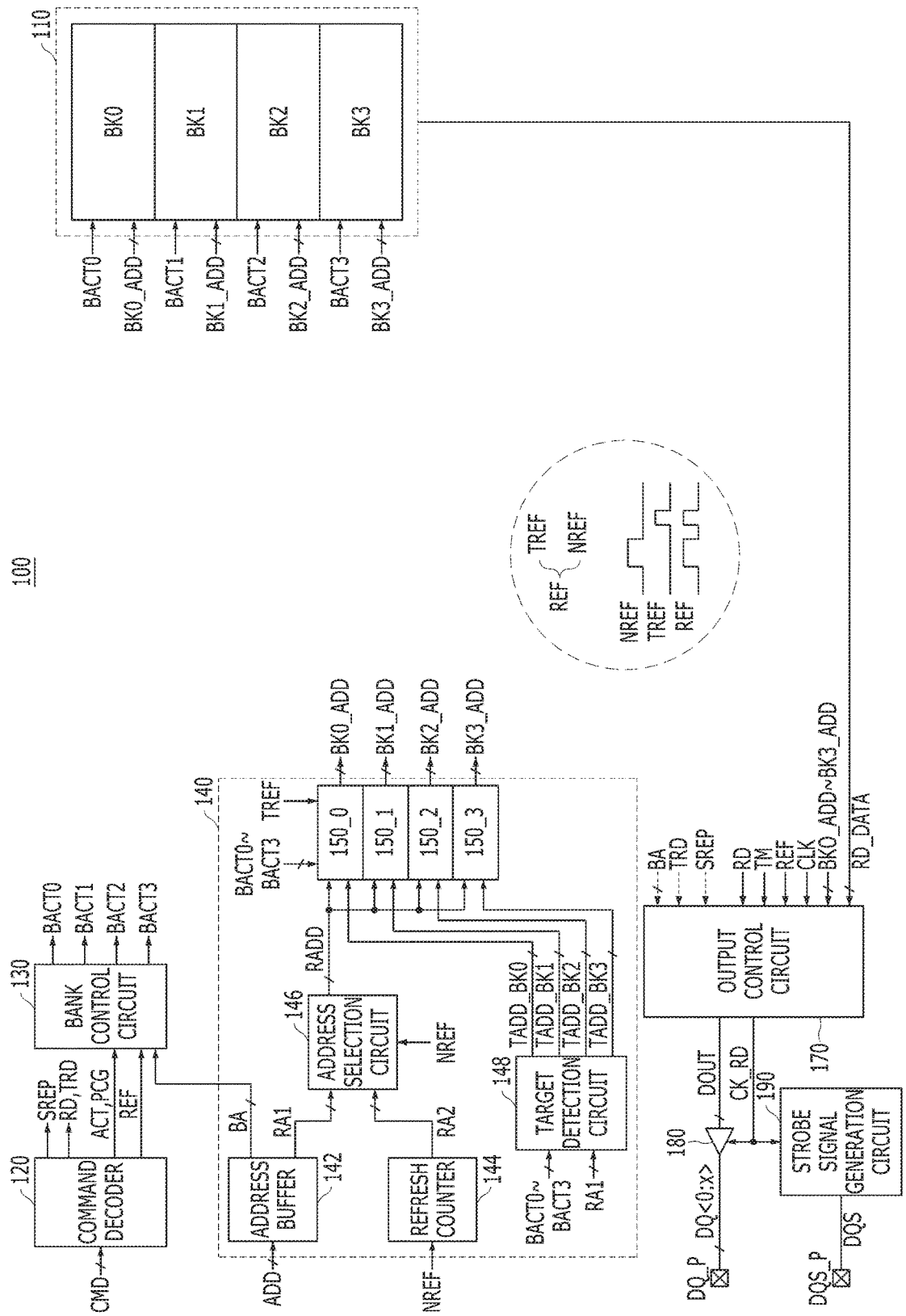
FIG. 1 is a block diagram of a semiconductor memory device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Throughout the specification, when one element is referred to as being 'connected to' or 'coupled to' another element, it may indicate that the former element is directly connected or coupled to the latter element or electrically connected or coupled to the latter element with another element interposed therebetween. Furthermore, when an element "includes" or "comprises" a component, it means that the element does not exclude another component but may further include or comprise another component, unless referred to the contrary. As used herein, singular forms may include the plural forms, unless the context clearly indicates otherwise. The articles 'a' and 'an' as used in this application and the appended claims should generally be construed to mean 'one or more' unless specified otherwise or clear from context to be directed to a singular form.

Hereinafter, a row control aspect related to a refresh operation will be mainly described. Furthermore, a case where four banks are provided in a memory cell array will be described as an example. However, the proposed embodiment is not limited thereto and a plurality of banks may be provided.

FIG. 1 is a block diagram of a semiconductor memory device 100 in accordance with an embodiment of the present invention.

Referring to FIG. 1, the semiconductor memory device 100 may include a memory cell array 110, a command decoder 120, a bank control circuit 130, an address generation circuit 140, an output control circuit 170, a data output buffer 180, and a strobe signal generation circuit 190.

The memory cell array 110 may include first to fourth banks BK0 to BK3. The first to fourth banks BK0 to BK3 may include a plurality of memory cells (not illustrated) arranged in an array form between a plurality of word lines (not illustrated) and a plurality of bit lines (not illustrated). Although not illustrated in the drawing, the first to fourth banks BK0 to BK3 each may include a plurality of cell matrices (not illustrated) in which the plurality of memory cells are arranged, and a plurality of sense amplifiers (not illustrated) shared by adjacent cell matrices. The first to fourth banks BK0 to BK3 may be activated according to first to fourth bank active signals BACT0 to BACT3, respectively, thereby accessing/activating word lines corresponding to row addresses for each bank, that is, first to fourth row addresses BK0_ADD to BK3_ADD.

The command decoder 120 may decode a command CMD inputted from an exterior (e.g., a memory controller), and generate an active signal ACT and a precharge signal PCG which are related to a data access operation; a self-refresh period signal SREP, a normal refresh command signal NREF, and a target refresh command signal TREF which are related to a refresh operation; and a read command signal RD and a test read signal TRD which are related to a data output operation. The command CMD may include a reset signal RST, a chip select signal /CS, a row address strobe signal /RAS, a column address strobe signal /CAS, a write enable signal /WE and the like is (not illustrated). The read command signal RD is a signal for reading data (hereinafter, referred to as "bank data RD_DATA") stored in the first to fourth banks BK0 to BK3 during a normal operation (that is, a normal read operation), and the test read signal TRD is a signal for reading the first to fourth row addresses BK0_ADD to BK3_ADD provided by the address generation circuit 140 during a refresh operation.

The refresh operation may be classified into an auto-refresh operation and a self-refresh operation. In the auto-refresh operation, addresses may be internally generated according to a command periodically inputted from an exterior while the semiconductor memory device is accessing data, and corresponding word lines may be sequentially activated. In the self-refresh operation, addresses may be internally generated by using a built-in timer to sequentially activate corresponding word lines during a period defined based on a self-refresh entry command and a self-refresh exit command inputted from an exterior when the semiconductor memory device performs no data access operation in a power-down mode and the like. The self-refresh period signal SREP is a signal for defining a period in which the self-refresh operation is performed, and may be activated according to the self-refresh entry command and deactivated according to the self-refresh exit command.

Furthermore, the refresh operation may be also classified into a normal refresh operation and a target refresh operation. The normal refresh operation may be an operation of sequentially activating word lines, and the target refresh operation may be an operation of additionally activating word lines adjacent to a target word line, in addition to the normal refresh operation. The target refresh operation may be performed in order to address a row hammering phenomenon in which a word line (i.e., a target word line) is repeatedly accessed (that is, active-precharged) a predetermined number of times or more and data of memory cells coupled to word lines adjacent to the target word line, are degraded. The normal refresh command signal NREF may be a signal that is activated to perform the normal refresh operation, and the target refresh command signal TREF may be a signal that is activated to perform the target refresh operation. Both the normal refresh command signal NREF and the target refresh command signal TREF may be defined as a refresh command signal REF. That is, the refresh command signal REF may be activated when the normal refresh command signal NREF or the target refresh command signal TREF is activated.

The bank control circuit 130 may generate the first to fourth bank active signals BACT0 to BACT3 for activating at least one of the first to fourth banks BK0 to BK3 according to a bank address BA, the active signal ACT, the precharge signal PCG, and the refresh command signal REF. The bank control circuit 130 may generate the bank active signals BACT0 to BACT3 corresponding to the banks BK0 to BK3, respectively. The bank control circuit 130 may activate a bank active signal of a bank corresponding to the bank address BA when the active signal ACT is applied, and deactivate the activated bank active signal when the precharge signal PCG is applied. When the refresh command signal REF is applied, the bank control circuit 130 may activate the bank active signal of the bank corresponding to the bank address BA during a predetermined period. The predetermined period may be defined as a value fixed in the specification by a tRFC (i.e., refresh cycle).

The address generation circuit 140 may include an address buffer 142, a refresh counter 144, an address selection circuit 146, a target detection circuit 148, and first to fourth address storage circuits 150_0 to 150_3.

The address buffer 142 may generate the bank address BA and a normal address RA1 by buffering and/or decoding an external address ADD. The refresh counter 144 may generate a counted address RA2 that sequentially increases according to the normal refresh command signal NREF. The normal address RA1 is an address that is used during the normal read operation, and the counted address RA2 is an address that is used during the normal refresh operation. The address selection circuit 146 may select one of the normal address RA1 and the counted address RA2 according to the normal refresh command signal NREF, and output the selected address as a row address RADD. The address selection circuit 146 may select the normal address RA1 when the normal refresh command signal NREF is deactivated, and select the counted address RA2 when the normal refresh command signal NREF is activated. The target detection circuit 148, based on the first to fourth bank active signals BACT0 to BACT3, may detect whether the normal address RA1 is accessed a predetermined number of times or more and may generate first to fourth target addresses TADD_BK0 to TADD_BK3. The target detection circuit 148 may generate the first to fourth target addresses TADD_BK0 to TADD_BK3 corresponding to the first to fourth banks BK0 to BK3, respectively.

The first to fourth address storage circuits 150_0 to 150_3 may correspond to the first to fourth banks BK0 to BK3, respectively, and provide the first to fourth banks BK0 to BK3 with the row addresses for each bank, that is, the first to fourth row addresses BK0_ADD to BK3_ADD, respectively.

Figure 2:
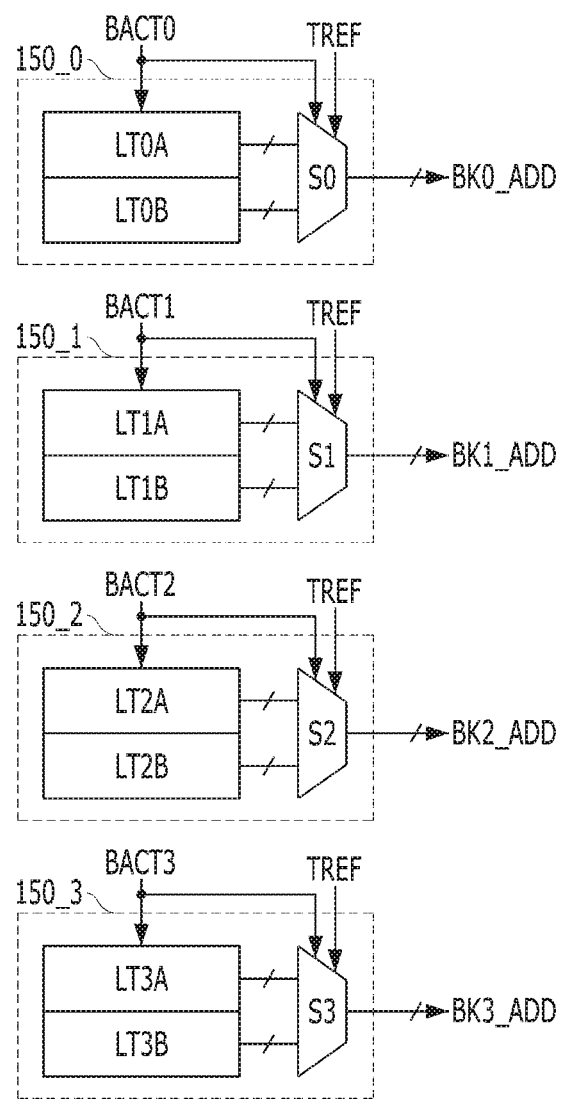
FIG. 2 is a detailed configuration diagram of first to fourth address storage circuits of FIG. 1.

FIG. 2 is a detailed configuration diagram of the first to fourth address storage circuits 150_0 to 150_3 of FIG. 1.

Referring to FIG. 2, the first to fourth address storage circuits 150_0 to 150_3 may include a plurality of first address storage circuits LT0A to LT3A, a plurality of second address storage circuits LT0B to LT3B, and a plurality of address selection circuits S0 to S3. For example, the first address storage circuit 150_0 may include a first address storage circuit LT0A, a second address storage circuit LT0B, and an address selection circuit S0. The first address storage circuit LT0A may store the row address RADD in response to the first bank active signal BACT0. The second address storage circuit LT0B may store the first target address TADD_BK0 provided from the target detection circuit 148. The address selection circuit S0 may select the address stored in the first address storage circuit LT0A or the address stored in the second address storage circuit LT0B in response to the first bank active signal BACT0 and provide the first row address BK0_ADD to the first bank BK0 when the target refresh command signal TREF is activated. In a similar manner, the second to fourth address storage circuits 150_1 to 150_3 may provide the second to fourth row addresses BK1_ADD to BK3_ADD to the second to fourth banks BK1 to BK3 in response to the second to fourth bank active signals BACT1 to BACT3 and the target refresh command signal TREF, respectively.

Referring back to FIG. 1, during the normal read operation, the output control circuit 170 may generate an output clock CK_RD according to the read command signal RD and a clock CLK, and output the bank data RD_DATA, which is provided from the first to fourth banks BK0 to BK3, as output data DOUT. During the refresh operation, the output control circuit 170 may generate the output clock CK_RD according to the refresh command signal REF and a test mode signal TM, and output the row addresses BK0_ADD to BK3_ADD, which are outputted from one of the first to fourth address storage circuits 150_0 to 150_3, as the output data DOUT. That is, in the proposed embodiment, the output control circuit 170 may generate the output clock CK_RD according to the read command signal RD, the clock CLK, the refresh command signal REF, and the test mode signal TM, select one of the row addresses BK0_ADD to BK0_ADD and the bank data RD_DATA, and output the selected one as the output data DOUT.

The data output buffer 180 may output the output data DOUT through a plurality of data input/output pads DQ_P according to the output clock CK_RD. Although one pad DQ_P is illustrated in FIG. 1, a plurality of pads may be actually implemented.

The strobe signal generation circuit 190 may generate a data strobe signal DQS according to the output clock CK_RD and output the data strobe signal DQS through a data strobe pad DQS_P. The strobe signal generation circuit 190 may generate a multi-phase clock (for example, a 4-phase clock) that is activated with a predetermined phase difference based on the output clock CK_RD, and generate the data strobe signal DQS that toggles at a predetermined cycle according to the multi-phase clock.

The output control circuit 170, the data output buffer 180, and the plurality of data input/output pads DQ_P may form a data output path through which a row address outputted from one of the first to fourth address storage circuits 150_0 to 150_3 may be outputted when a refresh operation is performed.

An operation of an embodiment will be described below based on the aforementioned description.

First, during the normal read operation, the command decoder 120 generates the active signal ACT, the precharge signal PCG, and the read command signal RD by decoding the command CMD. The address buffer 142 generates the bank address BA and the normal address RA1 by buffering and/or decoding the address ADD. The bank control circuit 130 activates the first bank active signal BACT0 of a bank (for example, the first bank BK0) corresponding to the bank address BA during a predetermined period according to the active signal ACT and the precharge signal PCG. The address selection circuit 146 selects the normal address RA1 to output the row address RADD. The first address storage circuit 150_0 may store the row address RADD in the first address storage circuit LT0A according to the first bank active signal BACT0, and provide the stored address to the first bank BK0 as the first row address BK0_ADD. Then, the word line of the first bank BK0 corresponding to the first row address BK0_ADD is selected and the bank data RD_DATA of memory cells electrically connected to the selected word line is provided to the output control circuit 170. The output control circuit 170 generates the output clock CK_RD according to the read command signal RD and the clock CLK, and outputs the bank data RD_DATA, which is provided from the first to fourth banks BK0 to BK3, as the output data DOUT. The data output buffer 180 may output the output data DOUT through the plurality of data input/output pads DQ_P according to the output clock CK_RD, and the strobe signal generation circuit 190 may generate the data strobe signal DQS according to the output clock CK_RD and output the data strobe signal DQS through the data strobe pad DQS_P.

Next, during the refresh operation, the command decoder 120 generates the refresh command signal REF and the test read signal TRD by decoding the command CMD. When the refresh command signal REF indicates the self-refresh operation, the command decoder 120 may also generate the self-refresh period signal SREP. The bank control circuit 130 activates the first bank active signal BACT0 of a bank (for example, the first bank BK0) corresponding to the bank address BA during a predetermined period according to the refresh command signal REF. In such a case, during the normal refresh operation, the refresh counter 144 generates the counted address RA2 that sequentially increases according to the normal refresh command signal NREF. The address selection circuit 146 selects the counted address RA2 to output the row address RADD. The first address storage circuit 150_0 may store the row address RADD in the first address storage circuit LT0A according to the first bank active signal BACT0, and provide the stored address to the first bank BK0 as the first row address BK0_ADD. On the other hand, during the target refresh operation, the first address storage circuit 150_0 may provide the first target address TADD_BK0 stored in the second address storage circuit LT0B to the first bank BK0 as the first row address BK0_ADD. Then, the word line of the first bank BK0 corresponding to the first row address BK0_ADD may be selected and a refresh operation may be performed on the selected word line.

In the embodiments, simultaneously with the execution of the refresh operation, the output control circuit 170 may generate the output clock CK_RD according to the refresh command signal REF and the test mode signal TM, and output the row addresses BK0_ADD to BK3_ADD, which are outputted from one of the first to fourth address storage circuits 150_0 to 150_3, as the output data DOUT. The data output buffer 180 may output the output data DOUT through the plurality of data input/output pads DQ_P according to the output clock CK_RD, and the strobe signal generation circuit 190 may generate the data strobe signal DQS according to the output clock CK_RD and output the data strobe signal DQS through the data strobe pad DQS_P.

During a conventional refresh operation, only active-precharge of a word line corresponding to a row address is performed and no data input/output operation through the data input/output pads DQ_P and the data strobe pad DQS_P is performed. However, in the embodiments according to the present invention, during a refresh operation, the row addresses BK0_ADD to BK3_ADD for each bank accessed when the refresh operation is performed may be provided in real-time to an exterior through the data input/output pads DQ_P. Consequently, accurate verification and analysis for the refresh operation are possible. Furthermore, FIG. 1 illustrates that the counted address RA2 during the normal refresh operation or the target addresses TADD_BK0 to TADD_BK3 during the target refresh operation are stored and outputted as the row addresses for each bank; however, the embodiments are not limited thereto. According to an embodiment, only the target addresses TADD_BK0 to TADD_BK3 may be outputted to an exterior.

Moreover, in an embodiment, the output control circuit 170 operates in a synchronous manner for the auto-refresh operation, and in another embodiment, the output control circuit 170 operates in an asynchronous manner for the self-refresh operation. That is, during the auto-refresh operation, since a clock CLK provided from an exterior is used, the output control circuit 170 may generate the output clock CK_RD synchronized with the clock CLK. In such a case, a first embodiment may include randomly outputting the row addresses BK0_ADD to BK3_ADD of banks selected according to the test read signal TRD and the bank address BA, and a second embodiment may include sequentially outputting the first to fourth row addresses BK0_ADD to BK3_ADD according to the refresh command signal REF. On the other hand, during the self-refresh operation, since the clock CLK provided from an exterior is not used, the output control circuit 170 may internally generate an oscillating clock OSC_CLK (not illustrated) according to the refresh command signal REF, and generate an output clock CK_RD synchronized with the oscillating clock OSC_CLK. In such a case, a third embodiment may include sequentially outputting the first to fourth row addresses BK0_ADD to BK3_ADD according to the oscillating clock OSC_CLK. In the third embodiment, the self-refresh period signal SREP may be used. In FIG. 1, reference numerals "BA", "TRD", and "SREP" indicated by dotted lines refer to signals used in only one of the first to third embodiments.

Hereinafter, with reference to the drawings, the first to third embodiments will be described in detail. For convenience of description, the first to fourth row addresses BK0_ADD to BK3_ADD outputted from the first to fourth address storage circuits 150_0 to 150_3 during the refresh operation will be referred to as "first to fourth refresh addresses BK0_ADD to BK3_ADD".

Figure 3:
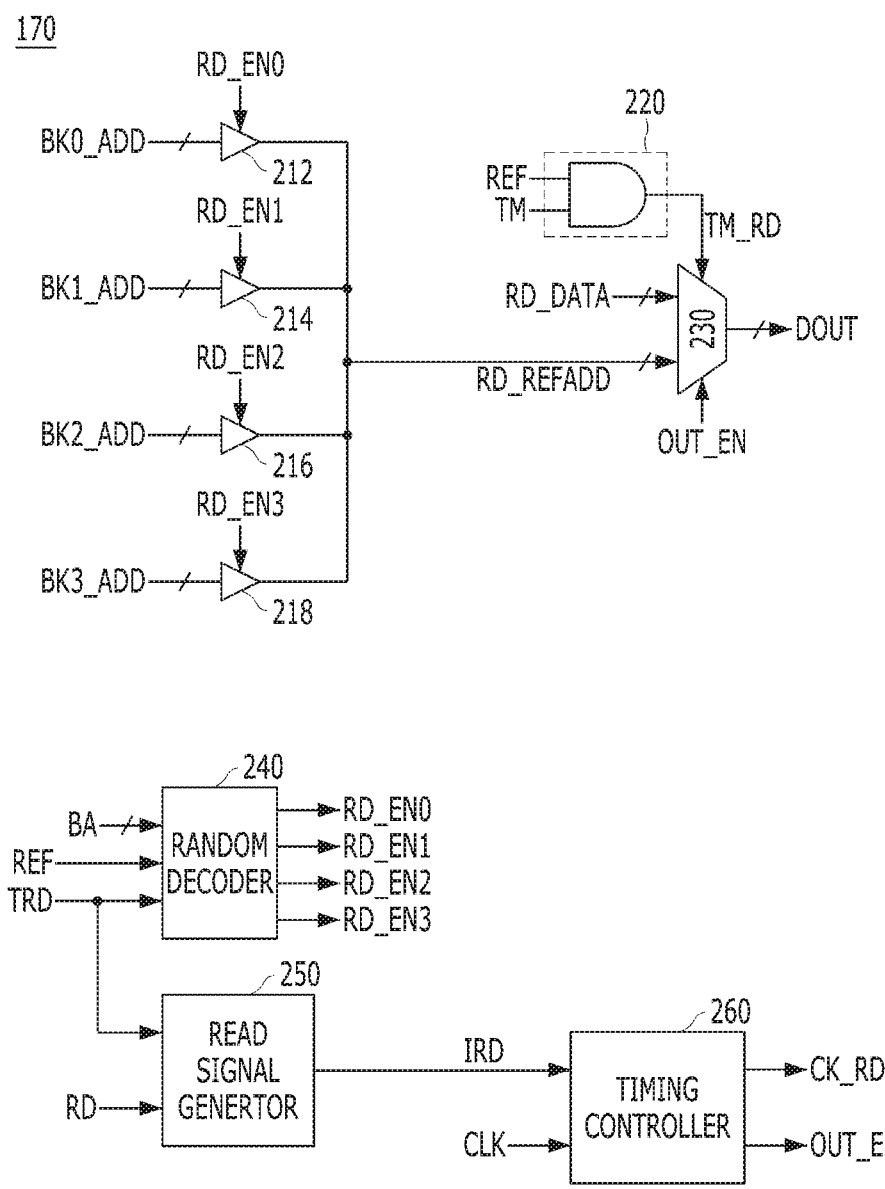
FIG. 3 is a detailed configuration diagram of an output control circuit in accordance with a first embodiment of the present invention.

FIG. 3 is a detailed configuration diagram of the output control circuit 170 in accordance with the first embodiment of the present invention.

Referring to FIG. 3, the output control circuit 170 may include first to fourth address transfer circuits 212, 214, 216, and 218, a selection control circuit 220, and a selection circuit 230.

The first to fourth address transfer circuits 212, 214, 216, and 218 may correspond to the first to fourth address storage circuits 150_0 to 150_3, respectively. The first to fourth address transfer circuits 212, 214, 216, and 218 may be activated according to first to fourth transfer enable signals RD_EN0 to RD_EN3, respectively, and may transfer the refresh addresses BK0_ADD to BK3_ADD stored in corresponding address storage circuits as an output address RD_REFADD. For example, the first address transfer circuits 212 may be activated according to the first transfer enable signal RD_EN0 and may transfer the first refresh address BK0_ADD stored in the first address storage circuit 150_0 as the output address RD_REFADD.

The selection control circuit 220 may generate a selection control signal TM_RD according to the refresh command signal REF and the test mode signal TM. Preferably, the selection control circuit 220 may be composed of a gate (for example, an AND gate) that performs a logic AND operation on the refresh command signal REF and the test mode signal TM. That is, when the levels of both the refresh command signal REF and the test mode signal TM become a logic high level, the selection control circuit 220 may generate a selection control signal TM_RD having a logic high level.

The selection circuit 230 may select one of the output address RD_REFADD and the bank data RD_DATA according to the selection control signal TM_RD and output the selected one as the output data DOUT. The selection circuit 230 may select the output address RD_REFADD when the level of the selection control signal TM_RD becomes a logic high level, and select the bank data RD_DATA when the level of the selection control signal TM_RD becomes a logic low level.

The output control circuit 170 in accordance with the first embodiment may further include a random decoder 240, a read signal generator 250, and a timing controller 260.

The random decoder 240 may generate the first to fourth transfer enable signals RD_EN0 to RD_EN3 by decoding the bank address BA according to the refresh command signal REF and the test read signal TRD. The random decoder 240 may be activated according to the refresh command signal REF, and may activate one of the first to fourth transfer enable signals RD_EN0 to RD_EN3 by decoding the bank address BA according to the test read signal TRD.

The read signal generator 250 may generate an internal read signal IRD according to the test read signal TRD or the read command signal RD. When the test read signal TRD or the read command signal RD is activated, the read signal generator 250 may activate and output the internal read signal IRD.

The timing controller 260 may generate the output clock CK_RD by using the clock CLK according to the internal read signal IRD. When the internal read signal IRD is activated, the timing controller 260 may output the output clock CK_RD synchronized with the clock CLK. Moreover, the timing controller 260 may generate an output enable signal OUT_EN by delaying the internal read signal IRD by a predetermined time according to the clock CLK. The selection circuit 230 may output the output data DOUT in synchronization with the output enable signal OUT_EN. In such a case, the timing controller 260 may generate the output enable signal OUT_EN at a timing before the read latency (RL), that is, before a time from the input of a read command to the actual output of output data.

Hereinafter, the normal read operation of the output control circuit 170 in accordance with the first embodiment will be described.

The read signal generator 250 generates the internal read signal IRD according to the read command signal RD. The timing controller 260 generates the output enable signal OUT_EN by delaying the internal read signal IRD by a predetermined time according to the clock CLK. The selection control circuit 220 may output a logic low level selection control signal TM_RD, and the selection circuit 230 may select the bank data RD_DATA to output the output data DOUT. Finally, the data output buffer 180 may output the output data DOUT through the plurality of data input/output pads DQ_P according to the output dock CK_RD, and the strobe signal generation circuit 190 may generate the data strobe signal DQS according to the output clock CK_RD and output the data strobe signal DQS through the data strobe pad DQS_P.

Figure 4:
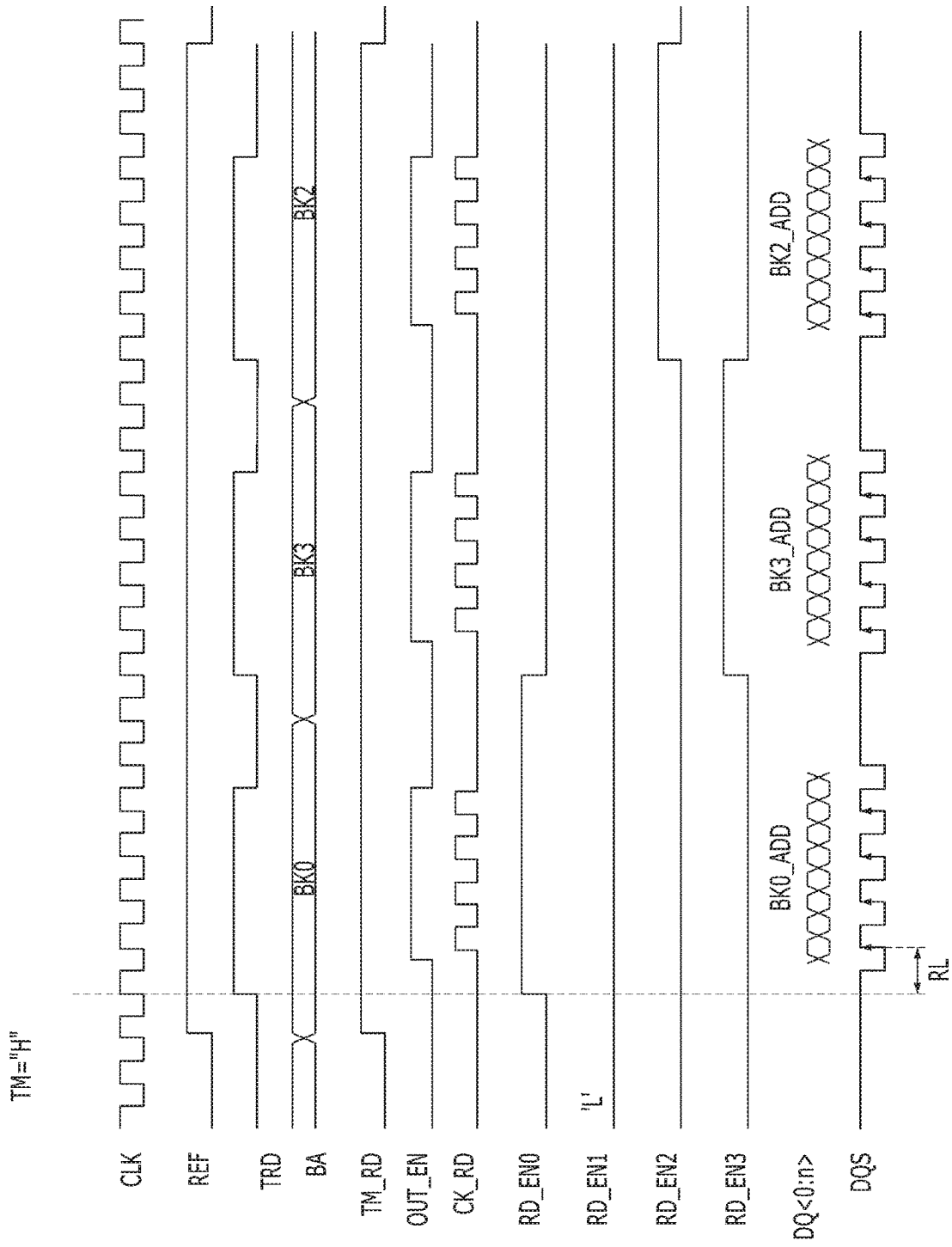
FIG. 4 is a timing diagram for describing an operation of an output control circuit of FIG.

FIG. 4 is a timing diagram for describing the operation of the output control circuit 170 of FIG. 3. FIG. 4 illustrates the operation of the output control circuit 170 when the refresh command signal REF is inputted in the state in which the test mode signal TM is inputted at a logic high level, that is, during the refresh operation.

Referring to FIG. 4, the random decoder 240 is activated according to the refresh command signal REF, and activates one of the first to fourth transfer enable signals RD_EN0 to RD_EN3 by decoding the bank address BA according to the test read signal TRD. For example, when the bank address BA designates the first bank BK0, the random decoder 240 may activate the first transfer enable signal RD_EN0, and when the bank address BA designates the fourth bank BK3, the random decoder 240 may activate the fourth transfer enable signal RD_EN3. The read signal generator 250 activates and outputs the internal read signal IRD according to the test read signal TRD. When the internal read signal IRD is activated, the timing controller 260 may output the output clock CK_RD synchronized with the clock CLK. Furthermore, the timing controller 260 generates the output enable signal OUT_EN by delaying the internal read signal IRD by a predetermined time according to the clock CLK. The timing controller 260 may activate the output enable signal OUT_EN at a time before the read latency (RL) that is a time from the input of the test read signal TRD to the output of the output data DOUT.

The first address transfer circuit 212 is activated according to the first transfer enable signal RD_EN0 and transfers the first refresh address BK0_ADD as the output address RD_REFADD. The selection control circuit 220 generates the selection control signal TM_RD of which the level becomes a logic high level according to the refresh command signal REF and the test mode signal TM. The selection circuit 230 may output the output address RD_REFADD as the output data DOUT according to the selection control signal TM_RD. In such a case, the selection circuit 230 may output the output data DOUT in synchronization with the output enable signal OUT_EN. Then, the fourth address transfer circuit 218 is activated according to the fourth transfer enable signal RD_EN3 and transfers the fourth refresh address BK3_ADD as the output address RD_REFADD. Similarly, the selection circuit 230 outputs the output address RD_REFADD as the output data DOUT according to the selection control signal TM_RD. Finally, the data output buffer 180 outputs the output data DOUT through the plurality of data input/output pads DQ_P according to the output clock CK_RD, and the strobe signal generation circuit 190 generates the data strobe signal DQS according to the output clock CK_RD and outputs the data strobe signal DQS through the data strobe pad DQS_P.

As described above, the output control circuit 170 in accordance with the first embodiment may generate the output clock CK_RD synchronization with the clock CLK provided from an exterior during the auto-refresh operation, and randomly output the refresh addresses BK0_ADD to BK3_ADD of banks selected according to the test read signal TRD and the bank address BA through the data input/output pads DQ_P according to the output clock CK_RD.

Figure 5:
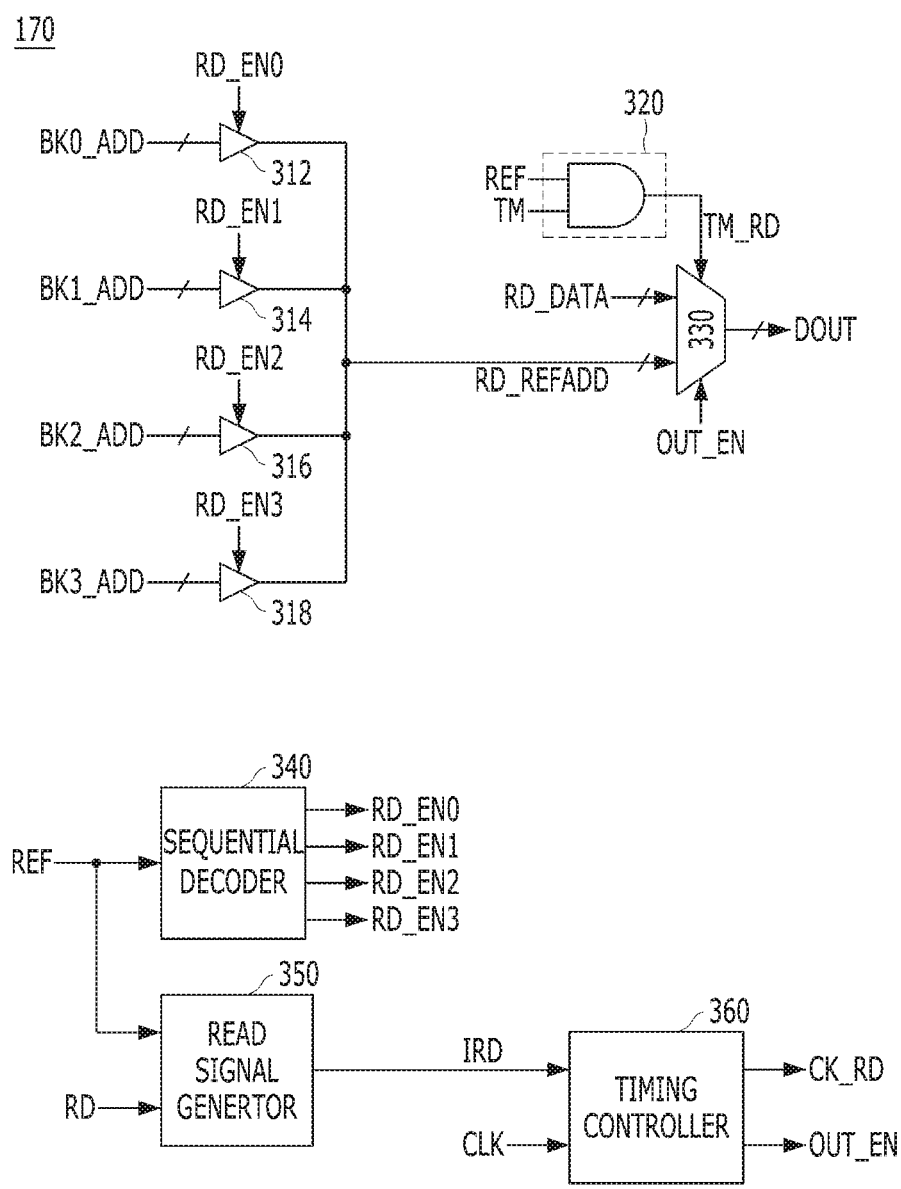
FIG. 5 is a detailed configuration diagram of an output control circuit in accordance with a second embodiment of the present invention.

FIG. 5 is a detailed configuration diagram of the output control circuit 170 in accordance with the second embodiment of the present invention.

Referring to FIG. 5, the output control circuit 170 may include first to fourth address transfer circuits 312, 314, 316, and 318, a selection control circuit 320, and a selection circuit 330.

The first to fourth address transfer circuits 312, 314, 316, and 318, the selection control circuit 320, and the selection circuit 330 of FIG. 5 may have substantially the same configurations as those of the first to fourth address transfer circuits 212, 214, 216, and 218, the selection control circuit 220, and the selection circuit 230 of FIG. 3.

The output control circuit 170 in accordance with the second embodiment may further include a sequential decoder 340, a read signal generator 350, and a timing controller 360.

The sequential decoder 340 may sequentially activate and output the first to fourth transfer enable signals RD_EN0 to RD_EN3 according to the refresh command signal REF.

The read signal generator 350 may generate the internal read signal IRD according to the refresh command signal REF or the read command signal RD. When the refresh command signal REF or the read command signal RD is activated, the read signal generator 350 may activate and output the internal read signal IRD.

The timing controller 360 may generate the output clock CK_RD by using the clock CLK according to the internal read signal IRD. When the internal read signal IRD is activated, the timing controller 360 may output the output clock CK_RD synchronized with the clock CLK. Furthermore, the timing controller 360 may generate the output enable signal OUT_EN by delaying the internal read signal IRD by a predetermined time according to the clock CLK. The selection circuit 330 may output the output data DOUT in synchronization with the output enable signal OUT_EN. In such a case, the timing controller 360 may generate the output enable signal OUT_EN at a timing before the read latency (RL) that is a time from the input of a read command to the actual output of output data.

The normal read operation of the output control circuit 170 in accordance with the second embodiment may be substantially the same as that of the output control circuit 170 in accordance with the first embodiment of the present invention.

Figure 6:
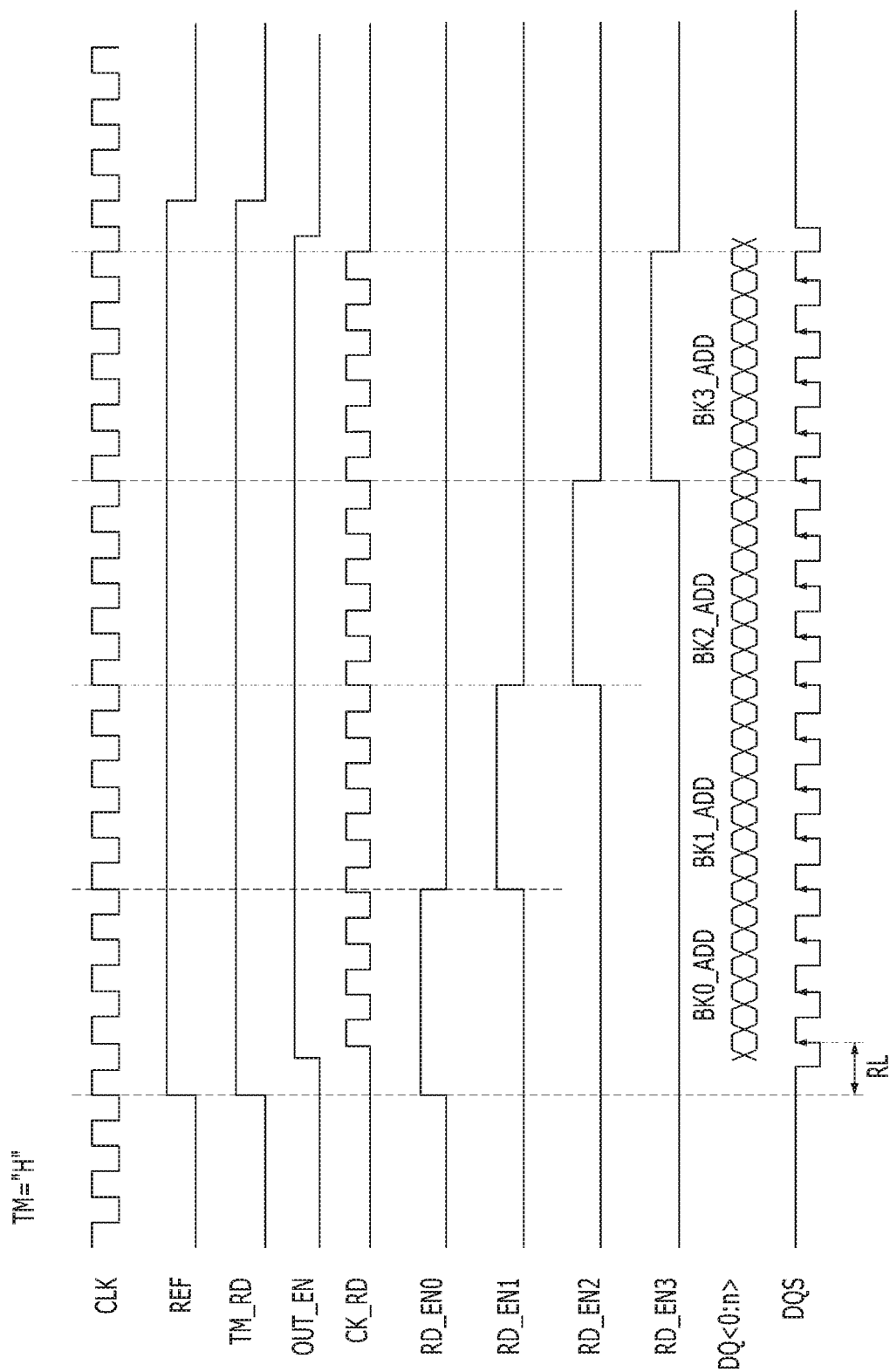
FIG. 6 is a timing diagram for describing an operation of an output control circuit of FIG. 5.

FIG. 6 is a timing diagram for describing the operation of the output control circuit 170 of FIG. 5. FIG. 6 illustrates the operation of the output control circuit 170 during the refresh operation.

Referring to FIG. 6, the sequential decoder 340 sequentially activates the first to fourth transfer enable signals RD_EN0 to RD_EN3 according to the refresh command signal REF. The read signal generator 350 activates and outputs the internal read signal IRD according to the refresh command signal REF. When the internal read signal IRD is activated, the timing controller 360 may output the output clock CK_RD synchronized with the clock CLK. Furthermore, the timing controller 360 generates the output enable signal OUT_EN by delaying the refresh command signal REF by a predetermined time according to the clock CLK. Since the output enable signal OUT_EN of FIG. 6 is activated according to the refresh command signal REF, it may have a continuous activation period.

The first to fourth address transfer circuits 312, 314, 316, and 318 are sequentially activated according to the first to fourth transfer enable signals RD_EN0 to RD_EN3 and sequentially transfer the first to fourth refresh addresses BK0_ADD to BK3_ADD as the output address RD_REFADD. The selection control circuit 320 may generate a selection control signal TM_RD of which the level becomes a logic high level according to the refresh command signal REF and the test mode signal TM, and the selection circuit 330 may output the output address RD_REFADD as the output data DOUT according to the selection control signal TM_RD. In such a case, the selection circuit 330 may output the output data DOUT in synchronization with the output enable signal OUT_EN. Finally, the data output buffer 180 outputs the output data DOUT to the plurality of data input/output pads DQ_P according to the output clock CK_RD. The strobe signal generation circuit 190 generates the data strobe signal DQS according to the output clock CK_RD and outputs the data strobe signal DQS through the data strobe pad DQS_P.

As described above, the output control circuit 170 in accordance with the second embodiment may generate the output clock CK_RD synchronized with the clock CLK provided from an exterior during the auto-refresh operation, and sequentially output the first to fourth refresh addresses BK0_ADD to BK3_ADD through the data input/output pads DQ_P according to the output clock CK_RD.

Figure 7:
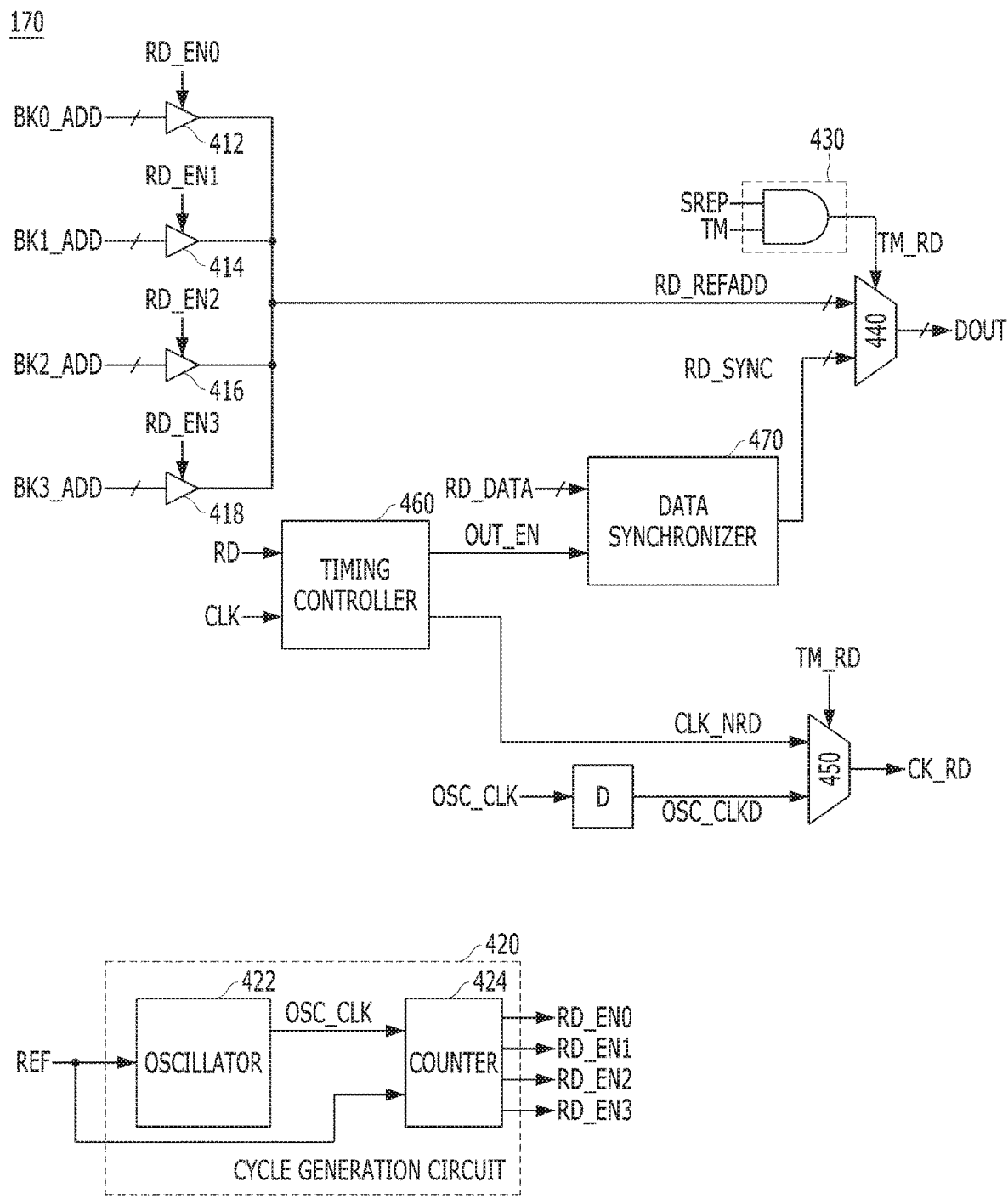
FIG. 7 is a detailed configuration diagram of an output control circuit in accordance with a third embodiment of the present invention.

FIG. 7 is a detailed configuration diagram of the output control circuit 170 in accordance with the third embodiment of the present invention.

Referring to FIG. 7, the output control circuit 170 may include first to fourth address transfer circuits 412, 414, 416, and 418, a cycle generation circuit 420, a selection control circuit 430, a first selection circuit 440, and a second selection circuit 450.

The first to fourth address transfer circuits 412, 414, 416, and 418 may correspond to the first to fourth address storage circuits 150_0 to 150_3, respectively. The first to fourth address transfer circuits 412, 414, 416, and 418 may be activated according to the first to fourth transfer enable signals RD_EN0 to RD_EN3, respectively, and may transfer the refresh addresses BK0_ADD to BK3_ADD stored in corresponding address storage circuits as the output address RD_REFADD.

The cycle generation circuit 420 may generate the oscillating clock OSC_CLK according to the refresh command signal REF, and generate the first to fourth transfer enable signals RD_EN0 to RD_EN3 that are sequentially activated based on the oscillating dock OSC_CLK. More specifically, the cycle generation circuit 420 may include an oscillator 422 and a counter 424. The oscillator 422 may generate the oscillating clock OSC_CLK that toggles at a predetermined cycle according to the refresh command signal REF. The counter 424 may count the oscillating clock OSC_CLK to generate the first to fourth transfer enable signals RD_EN0 to RD_EN3 that are sequentially activated. The counter 424 may be initialized according to the refresh command signal REF.

The selection control circuit 430 may generate the selection control signal TM_RD according to the self-refresh period signal SREP and the test mode signal TM. Preferably, the selection control circuit 430 may be composed of a gate (for example, an AND gate) that performs a logic AND operation on the self-refresh period signal SREP and the test mode signal TM. That is, when the levels of both the self-refresh period signal SREP and the test mode signal TM become a logic high level, the selection control circuit 430 may generate a selection control signal TM_RD of which the level becomes a logic high level.

The first selection circuit 440 may select one of the output address RD_REFADD and synchronized bank data RD_SYNC according to the selection control signal TM_RD and output the selected one as the output data DOUT. The first selection circuit 440 may select the output address RD_REFADD when the level of the selection control signal TM_RD becomes a logic high level, and select the synchronized bank data RD_SYNC when the level of the selection control signal TM_RD becomes a logic low level.

The second selection circuit 450 may select one of the oscillating clock OSC_CLK and a normal clock CLK_NRD according to the selection control signal TM_RD and output the selected clock as the output clock CK_RD. The second selection circuit 450 may select the oscillating clock OSC_CLK when the level of the selection control is signal TM_RD becomes a logic high level, and select the normal clock CLK_NRD when the level of the selection control signal TM_RD becomes a logic low level. Meanwhile, for the purpose of timing control, the oscillating clock OSC_CLK may be delayed through a delay D by a predetermined time and then provided to the second selection circuit 450. That is, the second selection circuit 450 may select one of the delayed oscillating clock OSC_CLKD and the normal clock CLK_NRD according to the selection control signal TM_RD and output the selected clock as the output clock CK_RD.

The output control circuit 170 may further include a timing controller 460 and a data synchronizer 470.

The timing controller 460 may generate the normal clock CLK_NRD synchronized with the clock CLK according to the read command signal RD. Furthermore, the timing controller 460 may generate the output enable signal OUT_EN by delaying the read command signal RD by a predetermined time according to the clock CLK. The data synchronizer 470 may allow the bank data RD_DATA to be synchronized with the output enable signal OUT_EN and output synchronized bank data RD_SYNC. The timing controller 460 and the data synchronizer 470 are provided for the normal read operation of the output control circuit 170.

Hereinafter, the normal read operation of the output control circuit 170 in accordance with the third embodiment will be described as follows.

The timing controller 460 generates the normal clock CLK_NRD synchronized with the clock CLK according to the read command signal RD, and generates the output enable signal OUT_EN by delaying the read command signal RD by a predetermined time according to the clock CLK. The data synchronizer 470 allows the bank data RD_DATA to be synchronized with the output enable signal OUT_EN and outputs the synchronized bank data RD_SYNC. The selection control circuit 430 generates a logic low level selection control signal TM_RD. The first selection circuit 440 may select the synchronized bank data RD_SYNC to output the output data DOUT, and the second selection circuit 450 may select the normal clock CLK_NRD to output the output clock CK_RD. Finally, the data output buffer 180 outputs the output data DOUT to the plurality of data input/output pads DQ_P according to the output clock CK_RD, and the strobe signal generation circuit 190 generates the data strobe signal DQS according to the output clock CK_RD and outputs the data strobe signal DQS through the data strobe pad DQS_P.

Figure 8:
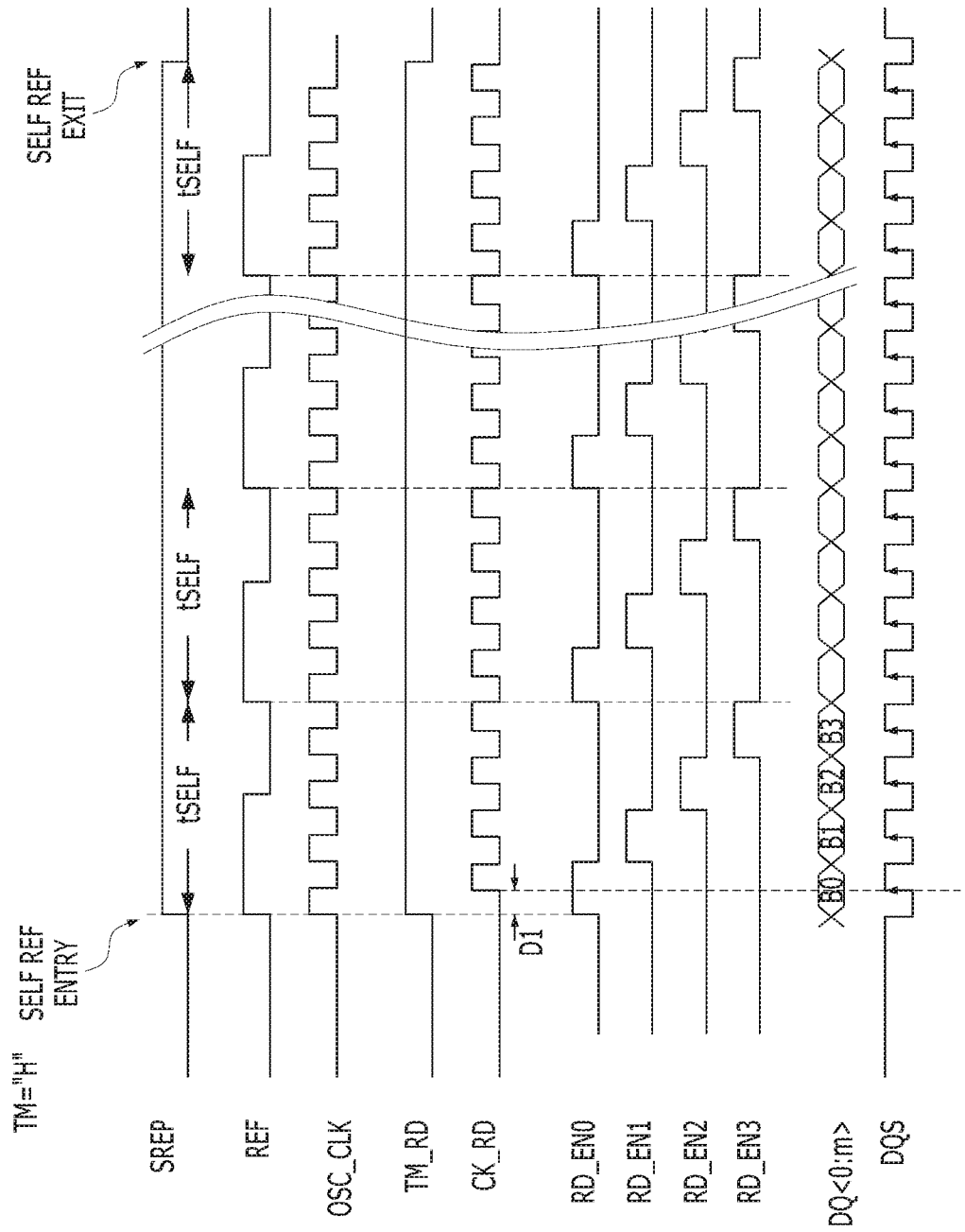
FIG. 8 is a timing diagram for describing an operation of an output control circuit of FIG. 7.

FIG. 8 is a timing diagram for describing the operation of the output control circuit 170 of FIG. 7. FIG. 8 illustrates the operation of the output control circuit 170 during the refresh operation.

Referring to FIG. 8, during the self-refresh operation, the command decoder (120 of FIG. 1) may generate the self-refresh period signal SREP that is activated according to the self-refresh entry command or is deactivated according to the self-refresh exit command. Furthermore, the command decoder 120 may generate the refresh command signal REF that toggles at a predetermined cycle (i.e., tSELF) during the activation period of the self-refresh period signal SREP.

The cycle generation circuit 420 generates the oscillating clock OSC_CLK according to the refresh command signal REF, and generates the first to fourth transfer enable signals RD_EN0 to RD_EN3 that are sequentially activated based on the oscillating clock OSC_CLK. That is, the cycle generation circuit 420 may generate the first to fourth transfer enable signals RD_EN0 to RD_EN3 that are sequentially activated during the cycle of one refresh command signal REF. The first to fourth address transfer circuits 412, 414, 416, and 418 are activated according to the first to fourth transfer enable signals RD_EN0 to RD_EN3 and sequentially transfer the first to fourth refresh addresses BK0_ADD to BK3_ADD as the output address RD_REFADD.

The selection control circuit 430 generates the selection control signal TM_RD of which the level becomes a logic high level according to the self-refresh period signal SREP and the test mode signal TM. The first selection circuit 440 may output the output address RD_REFADD as the output data DOUT and the second selection circuit 450 may select the delayed oscillating clock OSC_CLKD to output the output clock CK_RD according to the selection control signal TM_RD. As a consequence, during the cycle of one refresh command signal REF, the first to fourth refresh addresses BK0_ADD to BK3_ADD corresponding to the first to fourth banks BK0 to BK3 may be sequentially outputted. Finally, the data output buffer 180 outputs the output data DOUT to the plurality of data input/output pads DQ_P according to the output clock CK_RD, and the strobe signal generation circuit 190 generates the data strobe signal DQS according to the output clock CK_RD and outputs the data strobe signal DQS through the data strobe pad DQS_P.

As described above, the output control circuit 170 in accordance with the third embodiment may internally generate the oscillating clock OSC_CLK according to the refresh command signal REF, and may generate the output dock CK_RD synchronized with the oscillating clock OSC_CLK. Furthermore, the output control circuit 170 may sequentially output the first to fourth refresh addresses BK0_ADD to BK3_ADD through the data input/output pads DQ_P according to the output clock CK_RD.

In the aforementioned first to third embodiments, the number of data input/output pads DQ_P used may be adjusted. In the first embodiment and the second embodiment in which (n+1) data input/output pads DQ_P are used, the refresh addresses of the respective banks may be outputted by (n+1)*8 burst length (i.e., BL) bits at a time. On the other hand, in the third embodiment in which (m+1) data input/output pads DQ_P are used, the refresh addresses of the respective banks may be outputted by (m+1) bits. Accordingly, is in the third embodiment, it is possible to output more bits of refresh addresses by controlling the number of activations of the first to fourth transfer enable signals RD_EN0 to RD_EN3 generated by the cycle generation circuit 420.

As described above, in accordance with the embodiments, the semiconductor memory device may output in real-time row addresses for each bank accessed when the refresh operation is performed, so that accurate verification and analysis for the refresh operation are possible.

Although various embodiments have been described for illustrative purposes, it will be apparent to those skilled in the art that various changes and modifications may be made without departing from the spirit and scope of the invention as defined in the following claims.

For example, the positions and the types of the logic gates and the transistor in the aforementioned embodiments may be differentially embodied according to the polarity of an inputted signal.

What is claimed is:
1. A semiconductor memory device comprising:
a plurality of banks;
a plurality of address storage circuits respectively corresponding to the plurality of banks, and suitable for storing refresh addresses of corresponding banks;
an output control circuit suitable for, based on a refresh command signal and a test mode signal, generating an output clock and selectively outputting, as output data, a refresh address outputted from any one of the address storage circuits or bank data provided from the banks;

an output buffer suitable for outputting the output data to a plurality of data input/output pads based on the output clock; and a strobe signal generation circuit suitable for generating a data strobe signal based on the output clock and outputting the data strobe signal through a data strobe pad.

2. The semiconductor memory device of claim 1, wherein the output control circuit comprises:
a plurality of address transfer circuits respectively corresponding to the address storage circuits, and suitable for transferring, in response to a plurality of transfer enable signals, the refresh addresses stored in corresponding address storage circuits as an output address;
a selection control circuit suitable for generating a selection control signal based on the refresh command signal and the test mode signal; and
a selection circuit suitable for selecting the output address or the bank data according to the selection control signal to output as the output data.

3. The semiconductor memory device of claim 2, wherein the output control circuit further comprises:
a random decoder suitable for decoding a bank address based on the refresh command signal and a test read signal to generate the plurality of transfer enable signals; and
a timing controller suitable for generating, in response to the test read signal, the output clock based on a clock.

4. The semiconductor memory device of claim 3,
wherein the timing controller generates an output enable signal by delaying the test read signal by a predetermined time based on the clock, and
wherein the selection circuit outputs the output data in synchronization with the output enable signal.

5. The semiconductor memory device of claim 2, wherein the output control circuit further comprises:
a sequential decoder suitable for outputting the plurality of transfer enable signals sequentially activated according to the refresh command signal; and
a timing controller suitable for generating, in response to the refresh command signal, the output clock based on a clock.

6. The semiconductor memory device of claim 5,
wherein the timing controller generates an output enable signal by delaying the refresh command signal by a predetermined time based on the clock, and
wherein the selection circuit outputs the output data in synchronization with the output enable signal.

7. The semiconductor memory device of claim 2, wherein the refresh command signal is a command signal for performing an auto-refresh operation.

8. The semiconductor memory device of claim 1, wherein the output control circuit comprises:
a cycle generation circuit suitable for generating an oscillating clock in response to the refresh command signal and generating a plurality of transfer enable signals that are sequentially activated based on the oscillating clock;
a plurality of address transfer circuits respectively corresponding to the address storage circuits, and suitable for transferring, in response to the transfer enable signals, the refresh addresses stored in corresponding address storage circuits as an output address;
a selection control circuit suitable for generating a selection control signal based on a refresh period signal and the test mode signal;
a first selection circuit suitable for selecting the output address or the bank data according to the selection control signal to output as the output data; and
a second selection circuit suitable for selecting the oscillating clock or a clock according to the selection control signal to output as the output clock.

9. The semiconductor memory device of claim 8, wherein the output control circuit further comprises:
a timing controller suitable for generating an output enable signal by delaying a read command signal by a predetermined time based on the clock; and
a data synchronizer suitable for allowing the bank data to be synchronized with the output enable signal and providing the synchronized bank data to the first selection circuit.

10. The semiconductor memory device of claim 8, wherein the cycle generation circuit comprises:
an oscillator suitable for generating, in response to the refresh command signal, the oscillating clock which toggles at a predetermined cycle; and
a counter suitable for counting the oscillating clock to generate the plurality of transfer enable signals which are sequentially activated, wherein counter is initialized in response to the refresh command signal.

11. The semiconductor memory device of claim 8,
wherein the refresh command signal is a command signal for performing a self-refresh operation, and
wherein the refresh period signal is activated according to a self-refresh period entry and is deactivated according to a self-refresh period exit.

12. The semiconductor memory device of claim 1, further comprising:
a bank control circuit suitable for generating a plurality of bank active signals for activating the plurality of banks based on a bank address and the refresh command signal;
a refresh counter suitable for generating, in response to the refresh command signal corresponding to a normal refresh command signal, a counted address which sequentially increases; and
a target detection circuit suitable for detecting, in response to the bank active signals, a normal address which is accessed a predetermined number of times or more and outputting the detected normal address as a target address of a corresponding bank.

13. The semiconductor memory device of claim 12, wherein each of the plurality of address storage circuits comprises:
a first address storage circuit suitable for storing the counted address in response to a corresponding bank active signal among the plurality of bank active signals;
a second address storage circuit suitable for storing the target address provided from the target detection circuit; and
an address selection unit suitable for outputting, when the refresh command signal corresponding to a target refresh command signal is activated, an address which is stored in the first address storage circuit or the second address storage circuit, as the refresh address, according to the corresponding bank active signal.

14. A semiconductor memory device comprising:
a plurality of banks;
a plurality of address storage circuits respectively corresponding to the plurality of banks, and suitable for storing refresh addresses of corresponding banks;
a plurality of address transfer circuits respectively corresponding to the address storage circuits, and suitable for transferring, in response to a plurality of transfer enable signals, the refresh addresses stored in corresponding address storage circuits as an output address;
a selection circuit suitable for selecting the output address or bank data based on a refresh command signal and a test mode signal to output as output data; and
an output buffer suitable for outputting the output data through a plurality of input/output pads based on an output clock.

15. The semiconductor memory device of claim 14, further comprising:
a random decoder suitable for decoding a bank address based on the refresh command signal and a test read signal to generate the plurality of transfer enable signals;
a timing controller suitable for generating, in response to the test read signal, the output clock based on a clock; and
a strobe signal generation circuit suitable for generating a data strobe signal based on the output clock and outputting the data strobe signal through a data strobe pad.

16. The semiconductor memory device of claim 14, further comprising:
a sequential decoder suitable for outputting the plurality of transfer enable signals sequentially activated according to the refresh command signal;
a timing controller suitable for generating, in response to the refresh command signal, the output clock based on a clock; and
a strobe signal generation circuit suitable for generating a data strobe signal based on the output clock and outputting the data strobe signal through a data strobe pad.

17. The semiconductor memory device of claim 14, further comprising:
a bank control circuit suitable for generating a plurality of bank active signals for activating the plurality of banks based on a bank address and the refresh command signal; and
a target detection circuit suitable for detecting, in response to the bank active signals, a normal address which is accessed a predetermined number of times or more and outputting the detected normal address as a target address of a corresponding bank,
wherein the plurality of address storage circuits store the target address of the corresponding bank as the refresh address.

18. A semiconductor memory device comprising:
a plurality of banks;
a plurality of address storage circuits respectively corresponding to the plurality of banks, and suitable for storing refresh addresses of corresponding banks;
a plurality of address transfer circuits respectively corresponding to the address storage circuits, and suitable for transferring, in response to a plurality of transfer enable signals, the refresh addresses stored in corresponding address storage circuits as an output address;
a cycle generation circuit suitable for generating an oscillating clock in response to a refresh command signal and generating the transfer enable signals that are sequentially activated based on the oscillating clock;
a selection circuit, based on a refresh period signal and a test mode signal, suitable for selecting the output address or bank data to output as output data, and selecting the oscillating clock and a clock to output as an output clock; and
an output buffer suitable for outputting the output data through a plurality of input/output pads based on the output clock.

19. The semiconductor memory device of claim 18, wherein the cycle generation circuit comprises:
an oscillator suitable for generating, in response to the refresh command signal, the oscillating clock which toggles at a predetermined cycle; and
a counter suitable for counting the oscillating clock to generate the plurality of transfer enable signals which are sequentially activated.

20. The semiconductor memory device of claim 18, further comprising:
a strobe signal generation circuit suitable for generating a data strobe signal based on the output clock and outputting the data strobe signal through a data strobe pad;
a bank control circuit suitable for generating a plurality of bank active signals for activating the plurality of banks based on a bank address and the refresh command signal; and
a target detection circuit suitable for detecting, in response to the bank active signals, a normal address which is accessed a predetermined number of times or more and outputting the detected normal address as a target address of a corresponding bank,
wherein the plurality of address storage circuits store the target address of the corresponding bank as the refresh address.

* * * * *